(12) United States Patent
Yang

(10) Patent No.: US 11,870,264 B2
(45) Date of Patent: Jan. 9, 2024

(54) SYSTEM AND METHOD FOR CONTROLLING PHOTOVOLTAIC BALANCING

(71) Applicant: NANOOMENERGY CO., LTD., Jeju-si (KR)

(72) Inventor: Jihyeok Yang, Jeju-si (KR)

(73) Assignee: NANOOMENERGY CO., LTD., Jeju-si (KR)

( * ) Notice: Subject to any disclaimer, the term of this patent is extended or adjusted under 35 U.S.C. 154(b) by 294 days.

(21) Appl. No.: 17/296,961

(22) PCT Filed: Nov. 7, 2019

(86) PCT No.: PCT/KR2019/015017
§ 371 (c)(1),
(2) Date: May 25, 2021

(87) PCT Pub. No.: WO2020/111560
PCT Pub. Date: Jun. 4, 2020

(65) Prior Publication Data
US 2021/0408799 A1    Dec. 30, 2021

(30) Foreign Application Priority Data

Nov. 27, 2018  (KR) ......................... 10-2018-0148820

(51) Int. Cl.
*H02J 3/38* (2006.01)
*H02S 50/10* (2014.01)
(Continued)

(52) U.S. Cl.
CPC ............ *H02J 3/381* (2013.01); *G05B 19/042* (2013.01); *H02J 13/00022* (2020.01);
(Continued)

(58) Field of Classification Search
CPC .. H02J 3/381; H02J 13/00022; H02J 2300/24; G05B 19/042; G05B 2219/2639;
(Continued)

(56) References Cited

U.S. PATENT DOCUMENTS

| | | | |
|---|---|---|---|
| 2010/0082171 A1* | 4/2010 | Takehara | ............ H04L 41/0659 700/286 |
| 2011/0316343 A1* | 12/2011 | Krauser | ............ H01L 31/02021 307/77 |

(Continued)

FOREIGN PATENT DOCUMENTS

| | | |
|---|---|---|
| JP | 2014155271 A | 8/2014 |
| KR | 101061025 B1 | 8/2011 |

(Continued)

OTHER PUBLICATIONS

International Search Report of PCT/KR2019/015017, dated Feb. 25, 2020, English translation.

*Primary Examiner* — Charles Cai
(74) *Attorney, Agent, or Firm* — STIP Law Group, LLC

(57) ABSTRACT

The present invention relates to a system and a method for controlling photovoltaic balancing, the system comprising: photovoltaic modules wherein the photovoltaic modules are connected in series with each other; node balancing control units for blocking and switching the connected photovoltaic modules when measured data fall below current, voltage, and power control data set to control; a gateway unit for storing the measured data; a real-time control module for classifying, comparing, and analyzing the measured data, storing same in a database, and transmitting a control command to the gateway unit; and an integrated information server for monitoring photovoltaic component devices and measured values, analyzing and processing profile information of the component devices, and providing same to the real-time control module.

6 Claims, 7 Drawing Sheets

(51) Int. Cl.
*G05B 19/042* (2006.01)
*H02J 13/00* (2006.01)

(52) U.S. Cl.
CPC ...... *H02S 50/10* (2014.12); *G05B 2219/2639* (2013.01); *H02J 2300/24* (2020.01)

(58) Field of Classification Search
CPC .......... H02S 50/10; H02S 50/00; H02S 40/36; H02H 3/243; Y02E 60/00; Y04S 40/126; G01R 19/16547; G01R 19/16538; G01R 21/06; G08C 17/02
See application file for complete search history.

(56) References Cited

U.S. PATENT DOCUMENTS

| | | | | |
|---|---|---|---|---|
| 2015/0281241 | A1* | 10/2015 | Sharma | H04L 9/083 |
| | | | | 726/9 |
| 2018/0083450 | A1* | 3/2018 | Truong | H02J 3/46 |
| 2019/0393834 | A1* | 12/2019 | Har-Shai | G08B 13/14 |

FOREIGN PATENT DOCUMENTS

| | | | |
|---|---|---|---|
| KR | 20130001389 | A | 1/2013 |
| KR | 20180008820 | A | 1/2018 |
| KR | 20180112496 | A | 10/2018 |
| KR | 101958474 | B1 | 3/2019 |

* cited by examiner

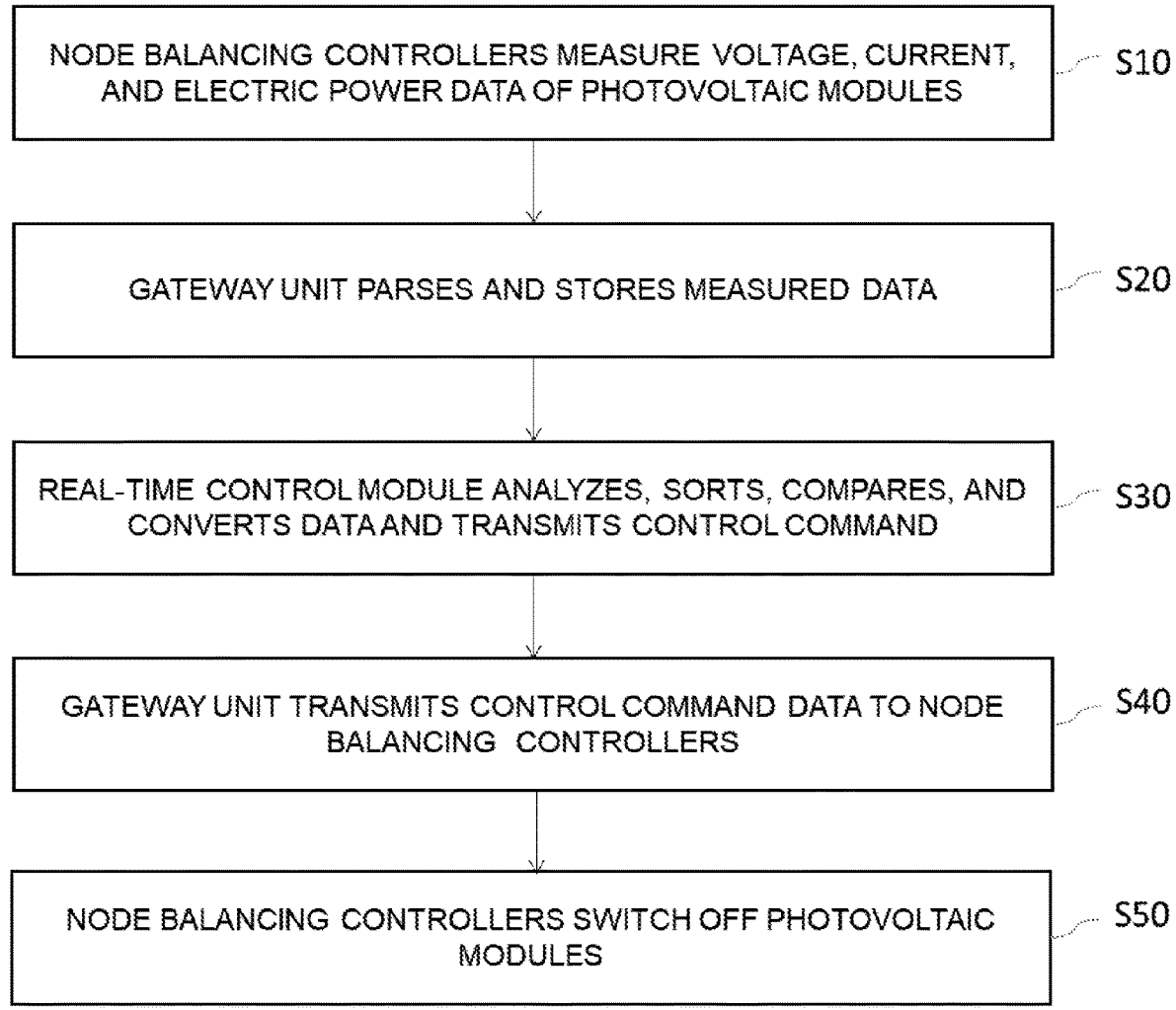

SYSTEM AND METHOD FOR CONTROLLING PHOTOVOLTAIC BALANCING

CROSS-REFERENCE TO RELATED APPLICATIONS

This application is the U.S. National Phase under 35 U.S.C. § 371 of International Application No. PCT/KR2019/015017 filed on Nov. 7, 2019, which in turn claims the benefit of Korean Application No. 10-2018-0148820 filed on Nov. 27, 2018, the disclosures of which are incorporated by reference into the present application.

TECHNICAL FIELD

The present invention relates to a photovoltaic power generation balancing control system and method, and more particularly to a photovoltaic power generation balancing control system and method capable of collecting voltage and electric power information of photovoltaic modules in real time and transmitting control information to switch off one or more of the photovoltaic modules that produce less electric power than a reference value, if any, whereby the amount of electric power produced by the photovoltaic modules is controlled so as to be uniform, and therefore the optimum production amount of electric power is maintained.

BACKGROUND ART

Photovoltaic power generation is a power generation method of converting sunlight into DC current to produce electricity. Photovoltaic panels, in each of which several solar cells are connected to each other, are arranged on a large scale in order to produce electricity using photovoltaic energy.

In order to solve environmental pollution and resource depletion problems, renewable energy projects have been actively promoted all over the world.

In Korea, photovoltaic power sources using solar energy have been increasingly installed every year in order to cope with environmental pollution and energy crisis, and state diagnosis technology for performance improvement and power generation amount forecasting technology are required.

Meanwhile, in the current maintenance and management system for photovoltaic power sources, only the output of an inverter of the overall system is measured, and simple on-site monitoring using a web cam is performed. When trouble occurs during operation, therefore, it takes much time to recognize performance deterioration and operation stoppage causes and positions at which trouble occurs. In addition, it is difficult to recognize change in power generation amount depending on trouble type, trouble pattern, and environmental change due to absence in data of photovoltaic power sources.

There are AMPP, FFv, and Osterwald's algorithm as conventional power generation amount forecasting technology. However, many parameters, such as temperature, quantity of solar radiation, open voltage, short-circuit current, inner resistance, and series resistance, must be considered, and it is difficult to consider the difference in power generation amount of a module, which is differently output depending on the state of the module under the same conditions.

Also, conventionally, in the case in which any one of a plurality of solar cell modules is in trouble, it is difficult to recognize which module is in trouble or is abnormal, and it is impossible to determine from a remote place whether the power generation amount is low due to low insolation or the power generation amount is reduced by module trouble or abnormality.

Particularly, in the case in which the power generation amount of a specific module of a photovoltaic panel that produces electric power is reduced due to module trouble or abnormality, the overall photovoltaic electric power amount is reduced, whereby electric power generation is hindered.

FIG. 1 is a schematic view showing a conventional general photovoltaic power generation state diagnosis system. In the conventional system, a plurality of photovoltaic modules 10a, 10b, 10n, 20a, 20b, and 20n is connected to each other in series or in parallel, and the power generation amount of all the photovoltaic modules connected to each other in series or in parallel is measured. As a result, it is difficult to recognize which module is actually in trouble although reduction in the power generation amount is sensed on one line.

DISCLOSURE

Technical Problem

The present invention has been made in view of the above problems, and it is an object of the present invention to provide a photovoltaic power generation balancing control system and method capable of collecting voltage and electric power information of photovoltaic modules in real time and transmitting control information to switch off one or more of the photovoltaic modules that produce less electric power than a reference value, if any, whereby the amount of electric power produced by the photovoltaic modules is controlled so as to be uniform, and therefore the optimum production amount of electric power is maintained.

Technical Solution

A photovoltaic power generation balancing control system according to the present invention includes a plurality of photovoltaic modules configured to convert photovoltaic energy into electrical energy in order to perform photovoltaic power generation, the photovoltaic modules being connected to each other in series so as to be arranged in at least two rows and at least two columns, node balancing controllers connected to photovoltaic modules, respectively, the node balancing controllers being configured to measure voltage, current, and electric power data produced by the photovoltaic modules and, when the measured data are less than set current, voltage, and electric power control data, to switch off the photovoltaic modules connected thereto, a gateway configured to receive the voltage, current, and electric power data measured by the photovoltaic modules from the node balancing controllers, to parse the measured data, and to store the measured data, a real-time controller configured to receive the current, voltage, and electric power data measured by the photovoltaic modules via the gateway, to sort, compare, and analyze the received data, to store the data in a database, and to transmit a control command for setting control data necessary to control the node balancing controllers to the gateway, and an integrated information server connected to the real-time controller over the Internet or a communication network, the integrated information server being configured to monitor a photovoltaic power generation construction device including the photovoltaic modules and measured values, to analyze and process profile information of construction devices including device functions, data, and changes, and to provide the analyzed and processed profile information to the real-time controller.

Also, in the photovoltaic power generation balancing control system according to the present invention, each of the node balancing controllers may include a data measure configured to measure voltage, current, and electric power data produced by a corresponding one of the photovoltaic modules, an analyzing controller configured to compare the measured data with the control data transmitted from the real-time controller, the control data being defined to control current and voltage, and to determine whether the measured data are less than the defined control data to switch the operation of a corresponding one of the photovoltaic modules, a data transmitter configured to transmit data stored in the node balancing controller to the outside, to receive the control data from the real-time controller, and to transmit the received control data to the node balancing controller, and a switch configured to switch off or on the photovoltaic module connected to the node balancing controller based on the result of determination of the analyzing controller.

Also, in the photovoltaic power generation balancing control system according to the present invention, the gateway may include a data collector configured to transmit the measured data received from the node balancing controllers to the real-time controller, to receive control command data transmitted from the real-time controller, and to transmit the received control command data to the node balancing controllers, a data processor configured to parse the measured data received from the node balancing controllers, and a data storage configured to store the data parsed by the data processor.

Also, in the photovoltaic power generation balancing control system according to the present invention, the real-time controller may include an interface configured to perform real-time data transmission and reception between the gateway and the real-time controller and between the real-time controller and the integrated information server, a data analyzer configured to receive the current, voltage, and electric power data measured by the photovoltaic module through the gateway and to sort, compare, and analyze the received data, a data controller configured to extract reference data necessary to control the photovoltaic modules using the result of processing of the data analyzer and to determine a control command, a control command processing unit configured to define control data in order to control the photovoltaic modules and to transmit the defined control data to the gateway in real time, and a service manager configured to perform a management function of adding or deleting a control function for controlling the photovoltaic modules in the real-time controller.

Also, in the photovoltaic power generation balancing control system according to the present invention, the integrated information server may include an interface configured to perform real-time data transmission and reception between the real-time controller and the integrated information server, a monitor configured to monitor a photovoltaic power generation construction device including the photovoltaic modules, the node balancing controllers, the gateway, and the real-time controller and measured values, a profile information processor configured to analyze and process profile information of photovoltaic power generation devices including photovoltaic power generation device functions, data, and changes and to provide the analyzed and processed profile information to the real-time controller, a modeling handler configured to extract functional data necessary for various services of the real-time controller, to perform modeling, and to store the result of modeling, and an application processor configured to convert information received from the modeling handler into an application program and to provide the application program through an interface module.

Meanwhile, a photovoltaic power generation balancing control method according to the present invention includes node balancing controllers measuring voltage, current, and electric power data produced by photovoltaic modules, a gateway receiving the measured data from the node balancing controllers, parsing the measured data, and storing the measured data, a real-time controller analyzing, sorting, comparing, and converting the parsed data, storing the data in a database, and transmitting a control command for setting control data necessary to control the node balancing controllers to the gateway, the gateway transmitting the control command data for setting the control data received from the real-time controller to the node balancing controllers, and the node balancing controllers switching off the photovoltaic modules connected thereto when the measured data are less than set current, voltage, and electric power control data.

Also, the photovoltaic power generation balancing control method according to the present invention may further include an integrated information server monitoring a photovoltaic power generation construction device and measured values, analyzing and processing profile information of construction devices including device functions, data, and changes, and providing the analyzed and processed profile information to the real-time controller.

Advantageous Effects

According to the present invention, voltage and electric power information of photovoltaic modules is collected in real time and control information is transmitted in order to switch off one or more of photovoltaic modules that produce less electric power than a reference value, if any, whereby the amount of electric power produced by the photovoltaic modules is controlled so as to be uniform, and therefore the optimum production amount of electric power is maintained.

In addition, the specifications of information transmission devices and electric devices used for various photovoltaic power generation and protocol are registered and managed, whereby information of various information transmission devices and electric devices connected to a low-level local space may be easily connected, and the protocol is defined, and service modules are developed.

DESCRIPTION OF DRAWINGS

FIG. 7 is a flowchart of a photovoltaic power generation balancing control method according to the present invention.

BEST MODE

Hereinafter, a photovoltaic power generation balancing control system and method according to embodiments of the present invention will be described in detail with reference to the accompanying drawings.

Figure 1:
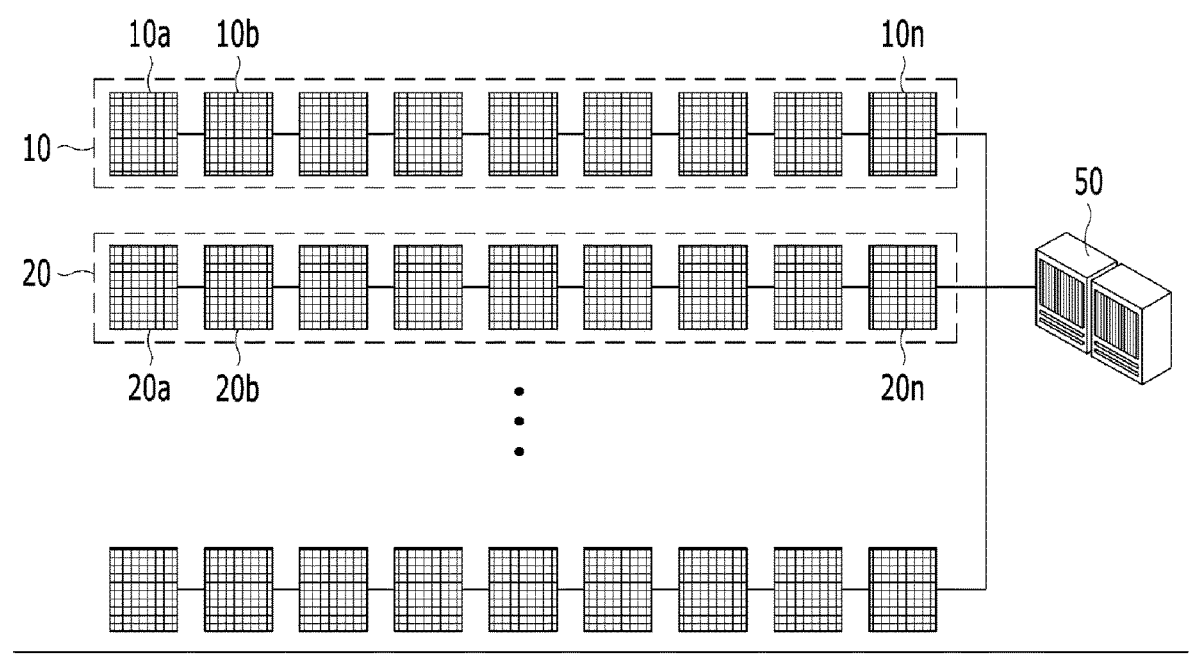
FIG. 1 is a schematic view showing a conventional general photovoltaic power generation state diagnosis system.
Figure 2:
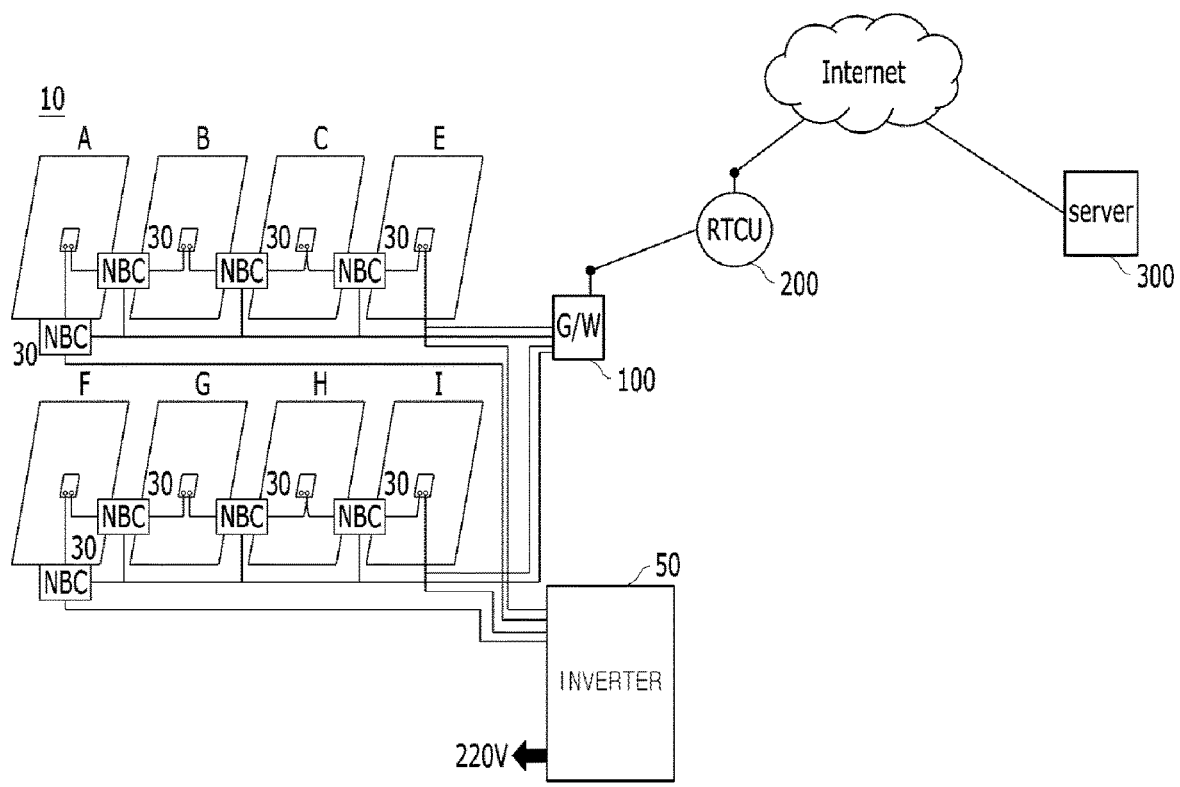
FIG. 2 is an overall construction block diagram of a photovoltaic power generation balancing control system according to the present invention.

FIG. 2 is an overall construction block diagram of a photovoltaic power generation balancing control system according to the present invention.

Referring to FIG. 2, the photovoltaic power generation balancing control system according to the embodiment of the present invention includes a plurality of photovoltaic modules 10, node balancing controllers (NBC) 30, an inverter 50, a gateway (G/W) 100, a real-time controller (RTCU), and an integrated information server 300.

The plurality of photovoltaic modules 10, which converts photovoltaic energy into electrical energy to perform photovoltaic power generation, is connected to each other in series so as to be arranged in at least two rows and at least two columns.

A photovoltaic power generator includes at least one string constituted by the photovoltaic modules 10, each of which is a minimum unit configured to transmit actually generated electricity to the outside, are connected to each other in series, and a plurality of strings is connected to each other so as to constitute an array. For large-scale photovoltaic power generation, a minimum of tens of arrays and a maximum of hundreds of arrays are installed.

Electric power produced by the plurality of photovoltaic modules is transmitted to the inverter 50 through 6 channels or 12 channels so as to be converted into alternating-current electric power, such as 220 V.

Each of the node balancing controllers 30 is connected to a corresponding one of the photovoltaic modules 10 in order to measure voltage, current, and electric power data produced by the photovoltaic module 10 connected thereto. When the measured data are less than set current, voltage, and electric power control data, the node balancing controller switches off the photovoltaic module connected thereto.

As shown in FIG. 2, the photovoltaic modules 10 (A to I) are connected to each other in series, and the node balancing controllers 30 are connected to the series-connected photovoltaic modules 10 in series so as to have the same structure.

Voltage, current, and electric power data are measured and collected from the photovoltaic modules connected to the node balancing controllers 30, and the measured data are compared with control data defined to control current and voltage transmitted from the real-time controller 200 to determine whether the measured data are less than the defined control data. The photovoltaic module 10 at the node determined to be in trouble, among the nodes connected to the node balancing controllers 30, is switched off, whereby electric power produced by the photovoltaic module 10 in trouble is not transmitted to the inverter 50. Consequently, electric power produced by all of the photovoltaic modules 10 is maintained uniform, whereby a nonuniform amount of electric power produced by the photovoltaic modules 10 is adjusted to achieve optimum electric power production. In this way, a balancing function is performed.

The gateway 100 receives the voltage, current, and electric power data measured by the photovoltaic modules 10 from the node balancing controllers 30, parses the measured data, and stores the measured data.

The real-time controller 200 receives the current, voltage, and electric power data measured by the photovoltaic modules 10 via the gateway 100, sorts, compares, and analyzes the received data, stores the same in a database, and transmits a control command for setting control data necessary to control the node balancing controllers 30 to the gateway 100.

In addition, the integrated information server 300, which is connected to the real-time controller 200 over the Internet or a communication network, monitors a photovoltaic power generation construction device including the photovoltaic modules and measured values, analyzes and processes profile information of construction devices including device functions, data, and changes, and provides the same to the real-time controller 200.

Figure 3:
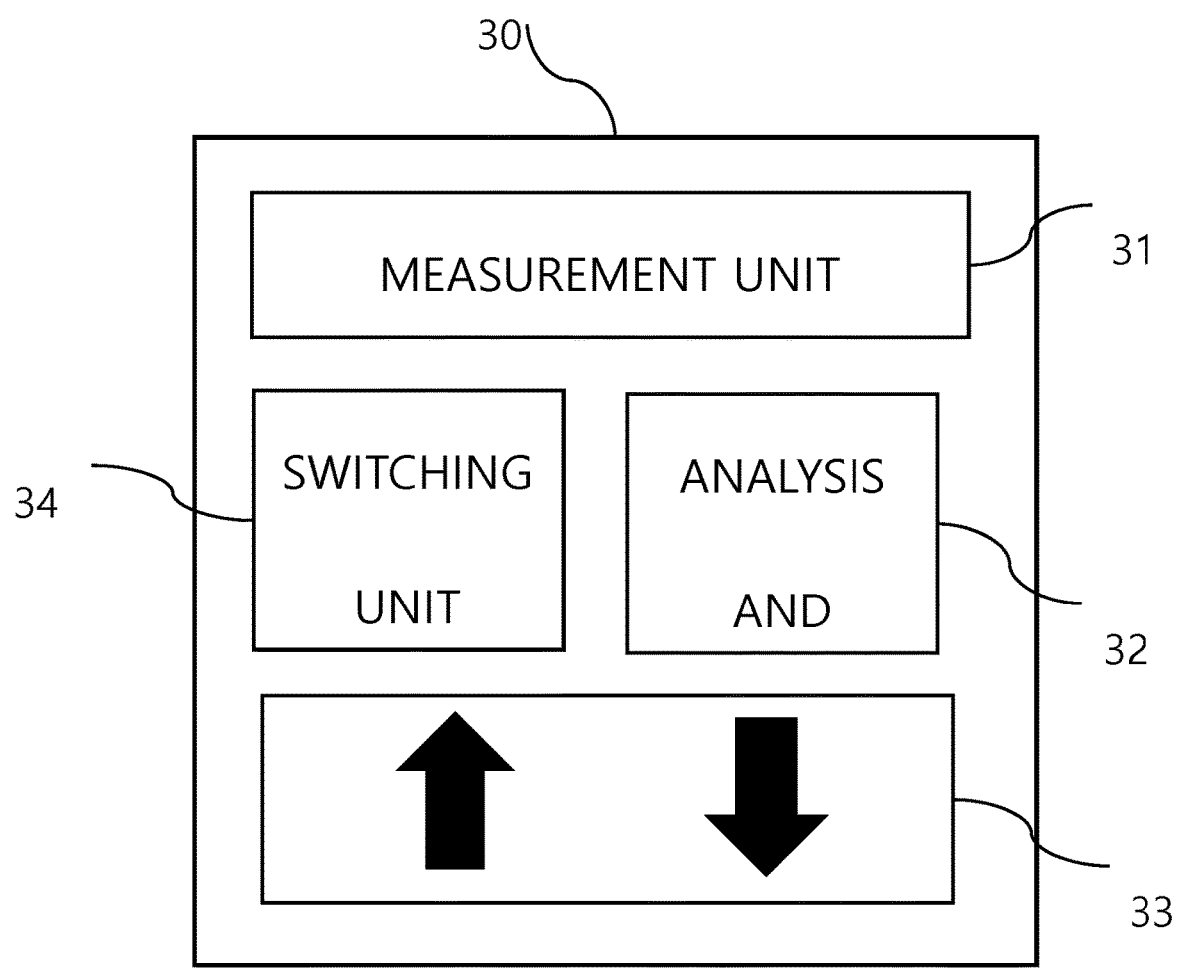
FIG. 3 is a construction block diagram of a node balancing controller in the photovoltaic power generation balancing control system shown in FIG. 2.

FIG. 3 is a construction block diagram of the node balancing controller in the photovoltaic power generation balancing control system shown in FIG. 2.

Referring to FIG. 3, in the photovoltaic power generation balancing control system according to the present invention, the node balancing controller 30 includes a data measure 31, an analyzing controller 32, a data transmitter 33, and a switch 34.

The data measure 31 measures voltage, current, and electric power data produced by the photovoltaic modules 10.

The data measure 31 measures voltage, current, and electric power produced by the photovoltaic modules 10, each of which is constituted by an electric power production panel, and transmits the same to the analyzing controller 32.

The analyzing controller 32 adjusts the operation level of the switch 34 based on the measured current, voltage, and electric power data of the photovoltaic modules secured from the data measure 31 and the current and voltage control data values transmitted from the real-time controller 200 and set such that the switch 34 switches off the photovoltaic module 10 connected to the node balancing controller 30.

That is, the analyzing controller 32 compares the measured data with the control data transmitted from the real-time controller 200, the control data being defined to control current and voltage of the photovoltaic module, and determines whether the measured data are less than the defined control data to switch the operation of the photovoltaic module.

The data transmitter 33 transmits data stored in the node balancing controller 30 to the outside, receives the control data from the real-time controller 200 via the gateway 100, and transmits the received control data to the node balancing controller 30.

In addition, the switch 34 switches off or on the photovoltaic module connected to the node balancing controller 30 based on the result of determination of the analyzing controller 32.

Figure 4:
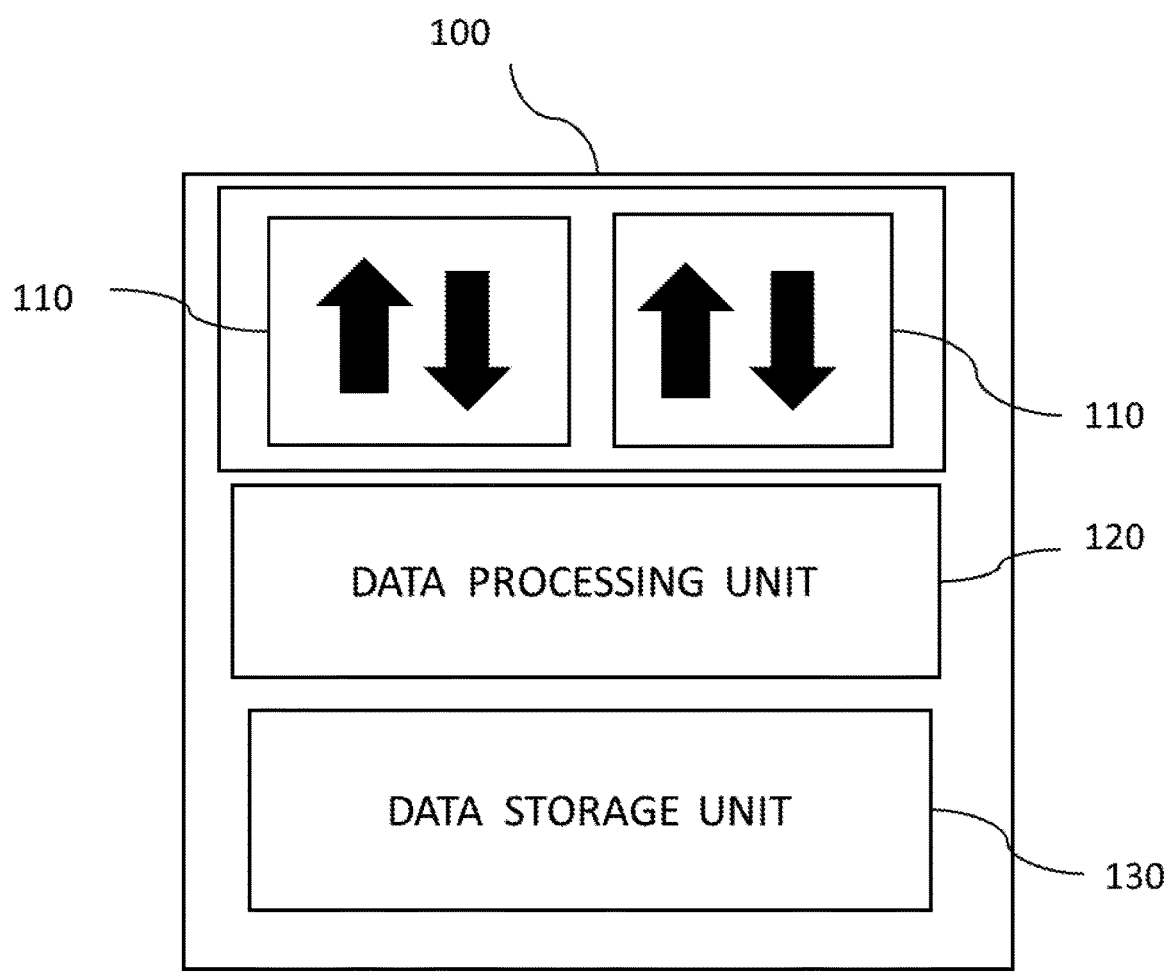
FIG. 4 is a construction block diagram of a gateway in the photovoltaic power generation balancing control system shown in FIG. 2.

FIG. 4 is a construction block diagram of the gateway in the photovoltaic power generation balancing control system shown in FIG. 2.

Referring to FIG. 4, in the photovoltaic power generation balancing control system according to the present invention, the gateway 100 includes a data collector 110, a data processor 120, and a data storage 130.

The data collector 110 transmits the measured data received from the node balancing controllers 30 to the real-time controller 200, receives control command data transmitted from the real-time controller 200, and transmits the same to the node balancing controllers 30.

Information transmitted to the data collector 110, which is information transmitted from the node balancing controllers 30, has a special management function in order for node balancing controllers 30 connected to 10×16 photovoltaic modules per gateway to safely transmit photovoltaic module connection data through connection or to safely transmit correct data through disconnection.

The data processor 120 parses the measured data received from the node balancing controllers 30.

The data are parsed (encoded/decoded) in order to minimize the amount of data that are transmitted/received by the data collector 110, and the parsed data are transmitted to and stored in the data storage 130.

The data storage 130 stores the data in a file data system structure or a database structure such that the stored information can be easily used, and the stored data are transmitted to the real-time controller 200 via the data collector 110.

Figure 5:
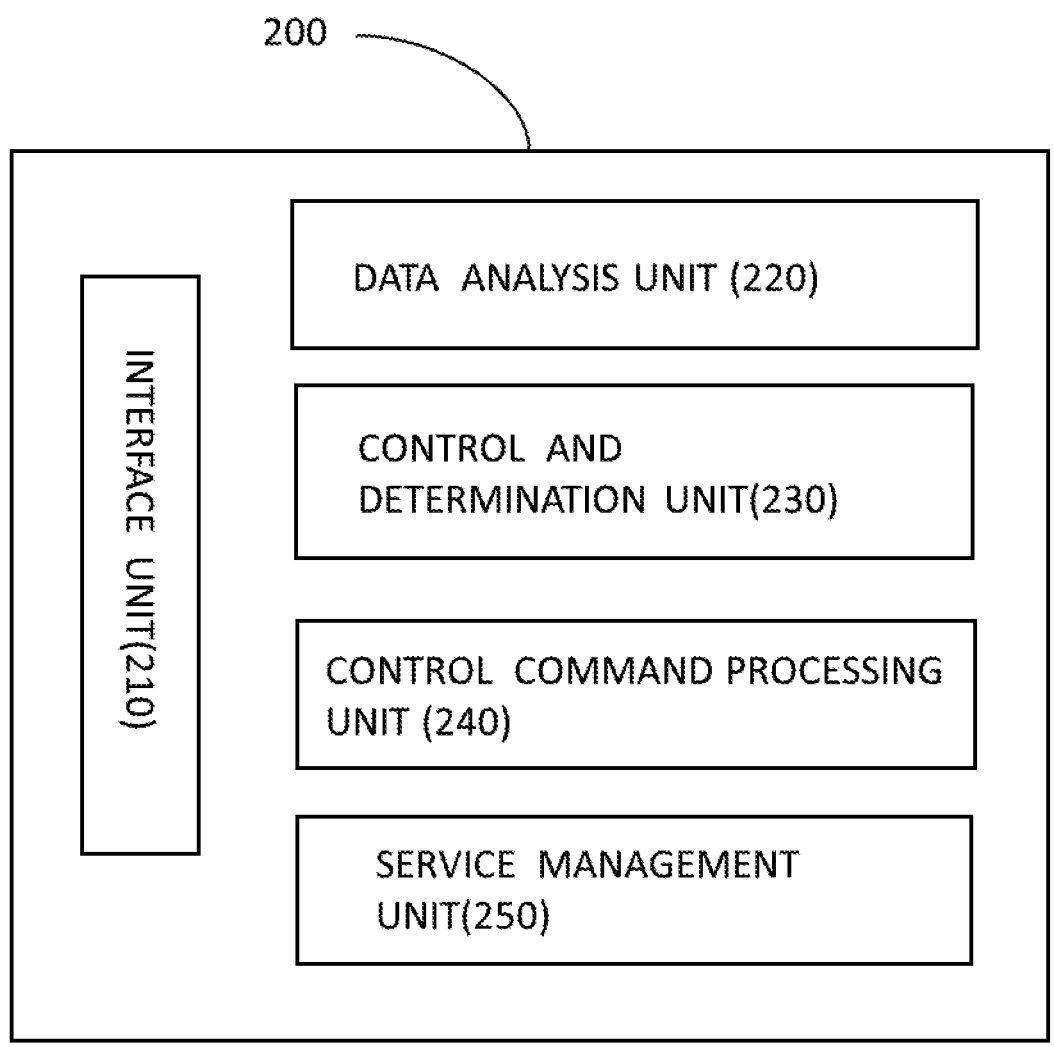
FIG. 5 is a construction block diagram of a real-time controller in the photovoltaic power generation balancing control system shown in FIG. 2.

FIG. 5 is a construction block diagram of the real-time controller in the photovoltaic power generation balancing control system shown in FIG. 2.

Referring to FIG. 5, in the photovoltaic power generation balancing control system according to the present invention, the real-time controller 200 includes an interface 210, a data analyzer 220, a data controller 230, a control command processing unit 240, and a service manager 250.

The interface 210 is configured to perform real-time data transmission and reception between the gateway 100 and the real-time controller 200 and between the real-time controller 200 and the integrated information server 300.

Data analyzed, determined, and decided in order to control the node balancing controllers 30 are transmitted as control command data through the open interface 210, whereby the node balancing controllers 30 perform the function of short circuit or connection together with current, voltage, and electric power production values of the photovoltaic modules.

The data analyzer 220 receives the current, voltage, and electric power data measured by the photovoltaic modules through the gateway 100, and analyzes, sorts, compares, and converts the same.

The data analyzer 220 receives photovoltaic power generation information, such as current, voltage, and electric power data measured for each photovoltaic module, through the interface 210, sorts, compares, and analyzes the data in sequence depending on characteristics thereof as a preprocessing process, and transmits the same to the data controller 230.

The data controller 230 extracts reference data necessary to control the photovoltaic modules using the result of processing of the data analyzer 220, and determines a control command.

The control command processing unit 240 defines control data in order to control the photovoltaic modules 10 and transmits the same to the gateway 100 in real time.

The service manager 250 performs a management function of adding or deleting a control function for controlling the photovoltaic modules 10 in the real-time controller 200.

Figure 6:
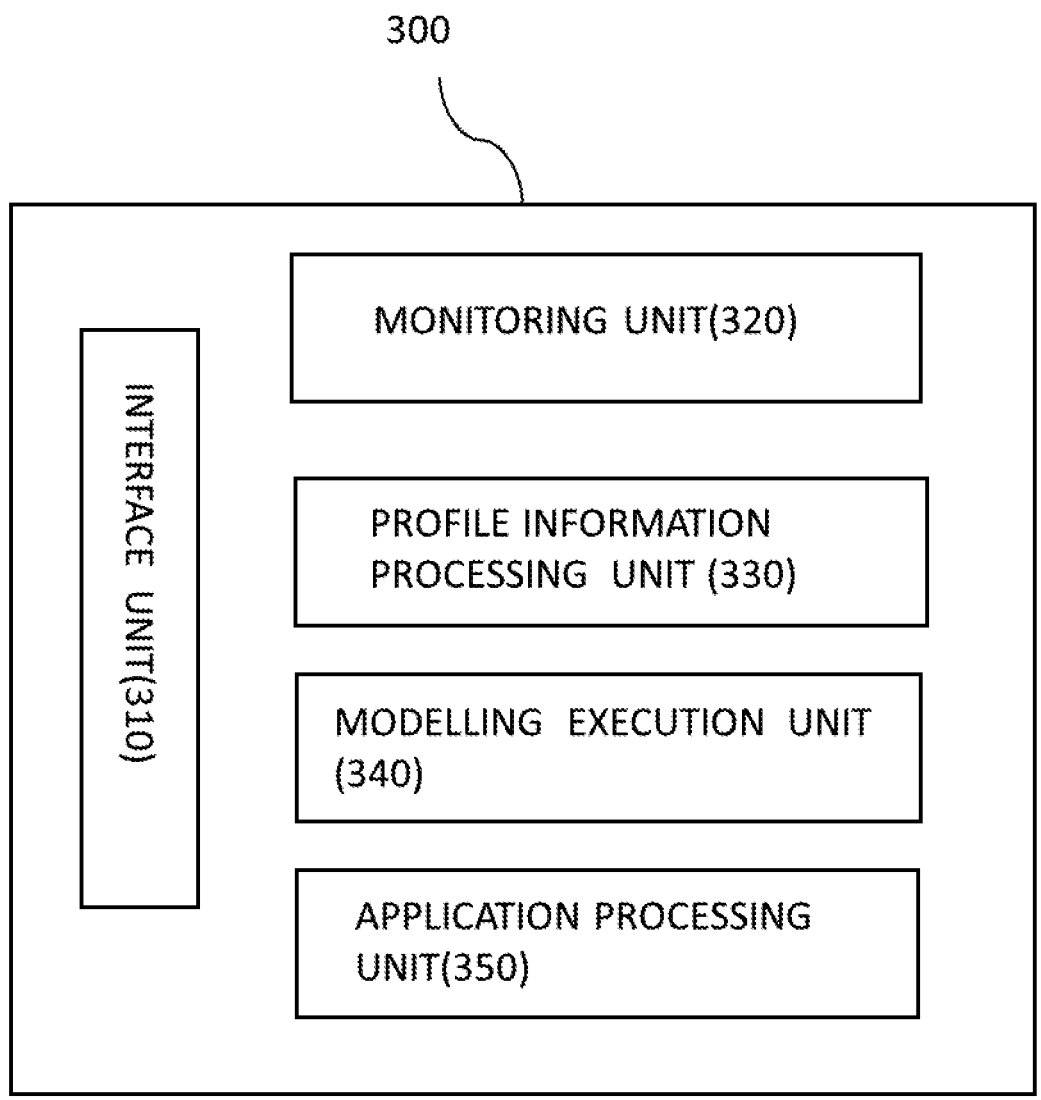
FIG. 6 is a construction block diagram of an integrated information server in the photovoltaic power generation balancing control system shown in FIG. 2.

FIG. 6 is a construction block diagram of the integrated information server in the photovoltaic power generation balancing control system shown in FIG. 2.

Referring to FIG. 6, in the photovoltaic power generation balancing control system according to the present invention, the integrated information server 300 includes an interface 310, a monitor 320, a profile information processor 330, a modeling handler 340, and an application processor 350.

The interface 310 performs real-time data transmission and reception between the real-time controller 200 and the integrated information server 300.

The integrated information server 300 is connected to the real-time controller 200 over the Internet or the communication network, and performs real-time data transmission and reception between the real-time controller 200 and the integrated information server 300. In addition, when data processed by the integrated information server 300 are converted into an application program, the interface 310 may provide various application services or data through an open type interface module.

The monitor 320 monitors the photovoltaic power generation construction device including the photovoltaic modules 10, the node balancing controllers 30, the gateway 100, and the real-time controller 200 and measured values.

In addition, the profile information processor 330 analyzes and processes profile information of photovoltaic power generation devices including photovoltaic power generation device functions, data, and changes, and provides the same to the real-time controller 200.

In addition, the modeling handler 340 extracts functional data necessary for various services of the real-time controller 200 in order to add or delete a service function in the real-time controller 200, performs modeling, and stores the result of modeling.

The application processor 350 converts information received from the modeling handler 340 into an application program, and the interface 310 provides the application program through the interface module.

The information provided by the application processor 350 provides various application services through the open type interface module, or provides information requested by various application programs.

FIG. 7 is a flowchart of a photovoltaic power generation balancing control method according to the present invention.

Referring to FIG. 7, the photovoltaic power generation balancing control process according to the present invention is performed as follows.

First, the node balancing controllers 30 measure voltage, current, and electric power data produced by the photovoltaic modules 10 (S10).

Subsequently, the gateway 100 receives the measured data from the node balancing controllers 30, parses the data, and stores the same (S20).

Upon receiving information transmitted from the gateway, the real-time controller 200 sorts, compares, and analyzes the parsed data, stores the same in a database, and transmits a control command for setting control data necessary to control the node balancing controllers 30 to the gateway (S30).

Subsequently, the gateway 100 transmits control command data necessary to set the control data received from the real-time controller 200 to the node balancing controllers 30 (S40).

In order to maintain the production amount of electric power uniform, the node balancing controllers 30 switch off the photovoltaic modules connected thereto when the currently measured current, voltage, and electric power data are less than the set current, voltage, and electric power control data (S50).

Meanwhile, a process of the integrated information server 300 monitoring the photovoltaic power generation construction device and the measured values, and analyzing and processing profile information of the construction devices including device functions, data, and changes, and providing the same to the real-time controller 200 may be added.

Consequently, the photovoltaic modules are switched off, whereby the amount of electric power that is produced by the photovoltaic modules is kept uniform, and therefore the photovoltaic modules are efficiently managed in order to maintain the optimum production amount of electric power.

In addition, the integrated information server registers and manages the specifications of information transmission devices and electric devices used for photovoltaic power generation and protocol, whereby information of various information transmission devices and electric devices connected to a low-level local space may be easily connected, and the protocol is defined, and service modules are developed, and therefore it is possible to recognize a connected device and, in addition, to recognize breakdown of the connected device.

Although the present invention has been described in detail with reference to concrete embodiments disclosed herein, it is apparent to those skilled in the art that various modifications and alterations are possible within the scope of the technical idea of the present invention, and it is obvious that such modifications and alterations belong to the appended claims.

INDUSTRIAL APPLICABILITY

According to the present invention, it is possible to efficiently manage photovoltaic modules so as to control the photovoltaic modules while measuring the amount of electric power generated by the photovoltaic modules. In addition, it is possible to control devices connected to the photovoltaic modules in real time, to analyze breakdown type characteristics thereof in real time, and to transmit the same to a user, whereby it is possible to efficiently control photovoltaic power generation.

The invention claimed is:

1. A photovoltaic power generation balancing control system comprising:
   a plurality of photovoltaic modules configured to convert photovoltaic energy into electrical energy in order to perform photovoltaic power generation, the photovoltaic modules being connected to each other in series so as to be arranged in at least two rows and at least two columns;
   node balancing controllers connected to photovoltaic modules, respectively, the node balancing controllers being configured to measure voltage, current, and electric power data produced by the photovoltaic modules and to switch off the photovoltaic modules connected thereto when the measured data are less than set current, voltage, and electric power control data;
   a gateway configured to receive the voltage, current, and electric power data measured by the node balancing controllers, to parse the measured data, and to store the measured data;
   a real-time controller configured to receive the current, voltage, and electric power data measured by the node balancing controllers via the gateway, to sort, compare, and analyze the received data, to store the data in a database, and to transmit a control data necessary to control the node balancing controllers to the gateway; and
   an integrated information server connected to the real-time controller over an Internet or a communication network, the integrated information server being configured to monitor photovoltaic power generation construction devices comprising the photovoltaic modules and measured values, to analyze and process profile information of the photovoltaic power generation construction devices, and to provide the analyzed and processed profile information to the real-time controller, wherein the profile information comprises photovoltaic power generation device functions, data, and changes.

2. The photovoltaic power generation balancing control system according to claim 1, wherein each of the node balancing controllers comprises:
   a measuring circuitry configured to measure voltage, current, and electric power data produced by a corresponding one of the photovoltaic modules;
   an analyzing controller configured to compare the measured data with the control data transmitted from the real-time controller, the control data being defined to control current and voltage, and to determine whether the measured data are less than the defined control data to switch an operation of a corresponding one of the photovoltaic modules;
   a data transmitter configured to transmit data stored in the node balancing controller to an outside, and to receive the control data from the real-time controller; and
   a switch configured to switch off or on the photovoltaic module connected to the node balancing controller based on a result of determination of the analyzing controller.

3. The photovoltaic power generation balancing control system according to claim 1, wherein the gateway comprises:
   a data collector configured to transmit the measured data received from the node balancing controllers to the real-time controller, to receive control data transmitted from the real-time controller, and to transmit the received control data to the node balancing controllers;
   a data processor configured to parse the measured data received from the node balancing controllers; and
   a data storage configured to store the data parsed by the data processor.

4. The photovoltaic power generation balancing control system according to claim 1, wherein the real-time controller comprises:
   an interface configured to perform real-time data transmission and reception between the gateway and the real-time controller and between the real-time controller and the integrated information server;
   a data analyzer configured to receive the current, voltage, and electric power data measured by the node balancing controllers through the gateway and to sort, compare, and analyze the received data;
   a data controller configured to extract reference data necessary to control the photovoltaic modules using a result of processing of the data analyzer and to determine a control command;
   a control command processor configured to define control data in order to control the photovoltaic modules and to transmit the defined control data to the gateway in real time; and
   a service manager configured to perform a management function of adding or deleting a control function for controlling the photovoltaic modules in the real-time controller.

5. The photovoltaic power generation balancing control system according to claim 1, wherein the integrated information server comprises:
   an interface configured to perform real-time data transmission and reception between the real-time controller and the integrated information server;

a monitor configured to monitor the photovoltaic power generation construction devices, the node balancing controllers, the gateway, and the real-time controller and measured values;

a profile information processor configured to analyze and process the profile information, and to provide the analyzed and processed profile information to the real-time controller;

a modeling handler configured to extract functional data necessary for various services of the real-time controller, to perform modeling, and to store a result of the modeling; and an application processor configured to convert information received from the modeling handler into an application program and to provide the application program through an interface module.

6. A photovoltaic power generation balancing control method comprising:

by node balancing controllers, measuring voltage, current, and electric power data produced by photovoltaic modules;

by a gateway, receiving the measured data from the node balancing controllers, parsing the measured data, and storing the measured data;

by a real-time controller, analyzing, sorting, comparing, and converting the parsed data, storing the parsed data in a database, and transmitting control data necessary to control the node balancing controllers to the gateway; and by an integrated information server, monitoring photovoltaic power generation construction devices and measured values, analyzing and processing profile information of the photovoltaic power generation construction devices, and providing the analyzed and processed profile information to the real-time controller, wherein the profile information comprises photovoltaic power generation construction device functions, data, and changes, wherein, the gateway transmits the control data received from the real-time controller to the node balancing controllers;

the node balancing controllers switches off the photovoltaic modules connected thereto when the measured data are less than set current, voltage, and electric power control data.

* * * * *